United States Patent
Karavidas et al.

(10) Patent No.: US 7,830,293 B2
(45) Date of Patent: Nov. 9, 2010

(54) METHOD OF CYCLICALLY CONVERTING AN ANALOG SIGNAL TO A MULTI-BIT DIGITAL SIGNAL AND CONVERTER FOR PERFORMING THE METHOD

(75) Inventors: Dimitrios Karavidas, Athens (GR); Guillaume De Cremoux, Edinburgh (GB); Sasa Ristic, Arnhem (NL); Yorgos Christoforou, Arnhem (NL)

(73) Assignee: NXP B.V., Eindhoven (NL)

( * ) Notice: Subject to any disclaimer, the term of this patent is extended or adjusted under 35 U.S.C. 154(b) by 333 days.

(21) Appl. No.: 11/629,054

(22) PCT Filed: Jun. 8, 2005

(86) PCT No.: PCT/IB2005/051865

§ 371 (c)(1),
(2), (4) Date: Feb. 23, 2010

(87) PCT Pub. No.: WO2005/122410

PCT Pub. Date: Dec. 22, 2005

(65) Prior Publication Data

US 2010/0201555 A1 Aug. 12, 2010

(30) Foreign Application Priority Data

Jun. 10, 2004 (EP) .................................. 04102648

(51) Int. Cl.
*H03M 1/38* (2006.01)

(52) U.S. Cl. ....................................... 341/161; 341/155
(58) Field of Classification Search .......... 341/155–165
See application file for complete search history.

(56) References Cited

U.S. PATENT DOCUMENTS

| | | | |
|---|---|---|---|
| 5,027,116 A | 6/1991 | Armstrong et al. | |
| 5,796,842 A * | 8/1998 | Hanna | 381/4 |
| 6,118,879 A * | 9/2000 | Hanna | 381/106 |
| 6,909,393 B2 * | 6/2005 | Atriss et al. | 341/163 |
| 6,967,611 B2 * | 11/2005 | Atriss et al. | 341/172 |
| 7,282,999 B2 * | 10/2007 | Da Dalt et al. | 331/1 A |
| 7,342,418 B2 * | 3/2008 | Moon | 326/83 |
| 7,376,057 B2 * | 5/2008 | Hirayama et al. | 369/47.27 |
| 7,629,917 B2 * | 12/2009 | Shinohara | 341/172 |
| 7,697,380 B2 * | 4/2010 | Cheng et al. | 369/44.13 |

* cited by examiner

*Primary Examiner*—Lam T Mai (57) ABSTRACT

Method and arrangement for cyclically AD converting an analog signal with a sampler capacitance and an integrator capacitance, comprising the steps of generating a difference signal multiplied by the ratio of said capacitances from the analog signal and a reference signal, deriving a digital bit from said difference signal, doubling the difference signal multiplied by said ratio, shifting said doubled signal by the reference signal multiplied by said ratio and using the shifted signal as difference signal multiplied by said ratio for the next cycle.

6 Claims, 7 Drawing Sheets

METHOD OF CYCLICALLY CONVERTING AN ANALOG SIGNAL TO A MULTI-BIT DIGITAL SIGNAL AND CONVERTER FOR PERFORMING THE METHOD

The present invention relates to a method for cyclically converting an analog input signal ($V_{in}$) to a digital output signal with a sampler capacitance ($C_1$) and an integrator capacitance ($C_2$).

Such AD-conversion is e.g. known from the U.S. Pat. No. 5,107,266. Cyclic AD-conversion has become popular because its integration on a semiconductor chip requires only a small chip area while with present day technology the conversion can be performed with relatively high speed. However, since operational amplifiers, integrated capacitors and MOST-switches are used, problems with such cyclic AD converters are capacitor mismatch, input offset voltage of the operational amplifier and the comparator, clock feed-through, channel charge injection and leakage currents of the switches. Input offset voltage of the operational amplifier and the comparator may be cancelled by so called auto-zero techniques that requires only a small amount of passive components. Channel charge injection and leakage currents may be solved by using fully differential structures by which all the excess charges become common mode signals which are cancelled at the output. Clock feed-through may be cancelled by tuning the clock pulses with a small difference from pulse to pulse. A remaining problem is the disturbing effect of capacitor mismatch that occurs on the digital output signal, because of the fact that the sampler capacitor and the integrator capacitor are not sufficiently equal and because parasitic capacitances have different influence on these two capacitances.

The above-mentioned US patent has as its main intention to cancel the offset voltage of the operational amplifier but does not solve the capacitor mismatch. In contradistinction therewith it is an object of the present invention to substantially minimize the effect of capacitor mismatch in a cyclic AD-converter. The method according to the invention is therefore characterized by comprising the steps of generating a difference signal by multiplying the difference of the analog signal ($V_i$) and a reference signal ($V_r$) by the ratio ($C_1/C_2$) of said capacitances, deriving at least one digital bit (D) from said difference signal, substantially doubling the difference signal, shifting said doubled difference signal by the reference signal multiplied by said ratio and using the shifted signal as difference signal multiplied by said ratio for a next cycle.

It has to be observed that the above-mentioned steps need not necessarily be executed in the given succession. For instance it is also possible to execute the shifting operation prior to the multiplying operation.

A preferred embodiment of the method according to the invention is a method whereby the digital output signal is a multi-bit digital word generated by means of an operational amplifier (A) having an opamp-output connected to a comparator (Q), the sampler capacitor ($C_1$), the integrator capacitor ($C_2$) and switch means ($S_0 \ldots S_8$) arranged and controlled to perform the conversion, characterized by:

generating the difference signal during a first phase-group of one or more clock-phases at the opamp-output (O), deriving the at least one digital bit (D) during a second phase-group of one or more clock-phases for constituting the digital word and delivering at said opamp-output (O) said difference signal multiplied by said capacitance ratio, substantially doubling the difference signal by generating during a third phase-group of one or more clock-phases at the opamp-output (O) a doubled difference signal which is substantially twice said analog difference signal multiplied by said capacitance-ratio, shifting said doubled difference signal by generating during a fourth phase-group of one or more clock-phases at the opamp-output a shifted analog signal which is the opamp-output signal delivered by the previous phase-group shifted by a bit-dependent reference signal multiplied by said capacitance ratio, and using said shifted signal as difference signal for the second phase-group of the next cycle.

It has to be observed that the above-mentioned phase-groups need not necessarily be executed in the given succession. For instance it is also possible to execute the shifting operation of the fourth phase-group prior to the multiplying operation of the third group.

In practice capacitance ratios will differ from their ideal or nominal values due to for instances tolerances during the manufacturing of the capacitors. The present invention is based on the insight that it is allowable to have the signal delivered by each phase-group to the next phase-group be "corrupted" by the capacitance ratio, provided that each of said analog signals is proportional to said capacitance ratio. This in contrast to the above-mentioned prior art where corrupted analog signals are added to uncorrupted analog signals, which results in a bit generation that may be seriously corrupted by the capacitance ratio being unequal to one.

In many applications one bit of the digital output signal is generated in one cycle of the cyclic AD-converter. Then, during the second phase-group, the bit value is determined by the polarity of the analog difference signal e.g. the bit is "high" when the analog difference signal is positive and the bit is "low" when the analog difference signal is negative. This decision criterion is not affected by the fact that the difference signal is multiplied by the capacitance ratio. However, if it is desired to compare the difference signal with a fixed reference value unequal to zero it is of importance to remove the capacitance ratio from the output signal of the opamp before this signal is applied to the comparator and the method according to the present invention may then be characterized by transferring during the second phase-group the charge of the integrator capacitor into the sampler capacitor, generating said at least one bit for constituting the digital word from the voltage across the sampler capacitor and subsequently transferring the charge of the sampler capacitor back into the integrator capacitor.

The multiplication by the factor two during the third phase-group may be done by copying, with the aid of the opamp, the voltage across the integrator capacitor to the sampler capacitor and subsequently, again with the aid of the opamp, transferring the charge of the sampler capacitor to the integrator capacitor. In this way the voltage across the integrator capacitor and also the opamp-output voltage is only exactly doubled if the capacitances of the two capacitors are exactly equal. Therefore, when the capacitances are not sufficiently equal the multiplication factor is corrupted which results in a corrupted bit-generation during the second phase group of the next cycle.

In case the difference between these capacitances is not sufficiently small their matching may be improved if the method according to the present invention is characterized by an iterative calibration process comprising the steps of charging the sampler capacitor with a calibration voltage, of transferring the charge of the sampler capacitor to the integrator capacitor, of comparing the voltage across the integrator capacitor with said calibration voltage and of adding trimming capacitance to the sampler capacitance if the result of said comparison is higher than 1 and by adding trimming capacitance to the integrator capacitance when the result of the comparison is lower than 1. It may be noted that the use of trimming capacitors to improve the equality of capacitances in a cyclic AD-converter is per se known from U.S. Pat. No. 5,027,116.

An alternative method to make the multiplication factor more exactly equal to 2 is characterized by the third phase-group comprising the steps of storing the opamp-output voltage in first and second storage capacitors, of connecting the first and second storage capacitors in series with the input of the opamp and connecting the integrator capacitor to the output of the opamp whereby the voltages of the first and second storage capacitors are added in the integrator capacitor, and of subsequently connecting the integrator capacitor between the inverting input and the output of the opamp. One of the storage capacitors may be connected in one of the input-leads of the operational amplifier and the other storage capacitor may be connected in the other input lead. Alternatively both storage capacitors may be series-connected in one of the input leads, preferably the lead to the inverting input of the opamp. It is noted that, whereas the sampler capacitor and the integrator capacitor are for instance relatively large poly-silicon or metal capacitors of e.g. 1 pF, the storage capacitor(s) may be small MOS (gate-oxide) capacitors of e.g. 0.1 pF that do use up substantially less chip area. Conveniently the sampler capacitance may be used as one of the storage capacitors because the sampler capacitor would otherwise be idle during this phase group and it saves an extra capacitor and some switches.

The invention also covers a cyclic switched capacitor AD-converter specifically intended for carrying out a method according to one or more of the accompanying claims.

The invention will be described with reference to the accompanying figures. Herein shows.

Figure 1:
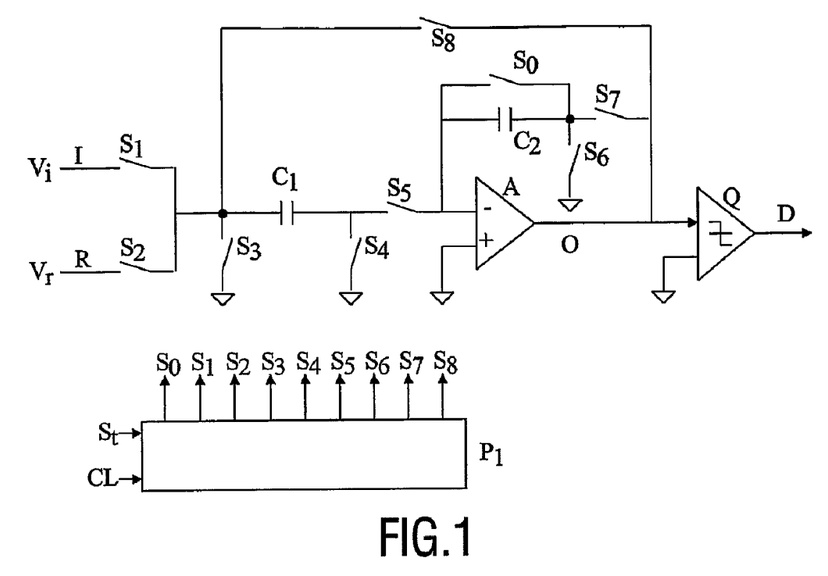
FIG. 1 a schematic diagram of a cyclic AD converter according to the invention.

The cyclic switched capacitor AD-converter of FIG. 1 comprises an input terminal I for an analog input signal $V_i$, an input terminal R for a reference voltage $V_r$ that lies half way in the range between the minimum and the maximum value of $V_i$, a sampler capacitor $C_1$, an integrator capacitor $C_2$, an operational amplifier (opamp) A with an opamp-output terminal O and a comparator Q having its input connected to the output of the opamp. The converter further comprises a plurality of switches $S_0 \ldots S_8$. The switch $S_0$ bridges the capacitor 2. The switches $S_1$ and $S_2$ respectively connect the input terminals I and R to the left hand plate of capacitor $C_1$, the switches $S_3$ and $S_8$ respectively connect the left hand plate of $C_1$ to ground and to the opamp-output O, the switches $S_4$ and $S_5$ respectively connect the right hand plate of $C_1$ to ground and to the inverting input of the opamp A and the switches $S_6$ and $S_7$ respectively connect the right hand plate of the integrator capacitor $C_2$ to ground and to the opamp-output O. The inverting input of the opamp is connected to the left hand plate of the capacitor $C_2$ and the non-inverting input of the opamp is connected to ground. The converter further contains a clock-pulse controlled pulse generator $P_1$ with a clock-pulse input CL, a start pulse input $S_t$ and nine pulse-outputs for controlling the open- and close-phases of the nine switches $S_0 \ldots S_8$.

Figure 2A:
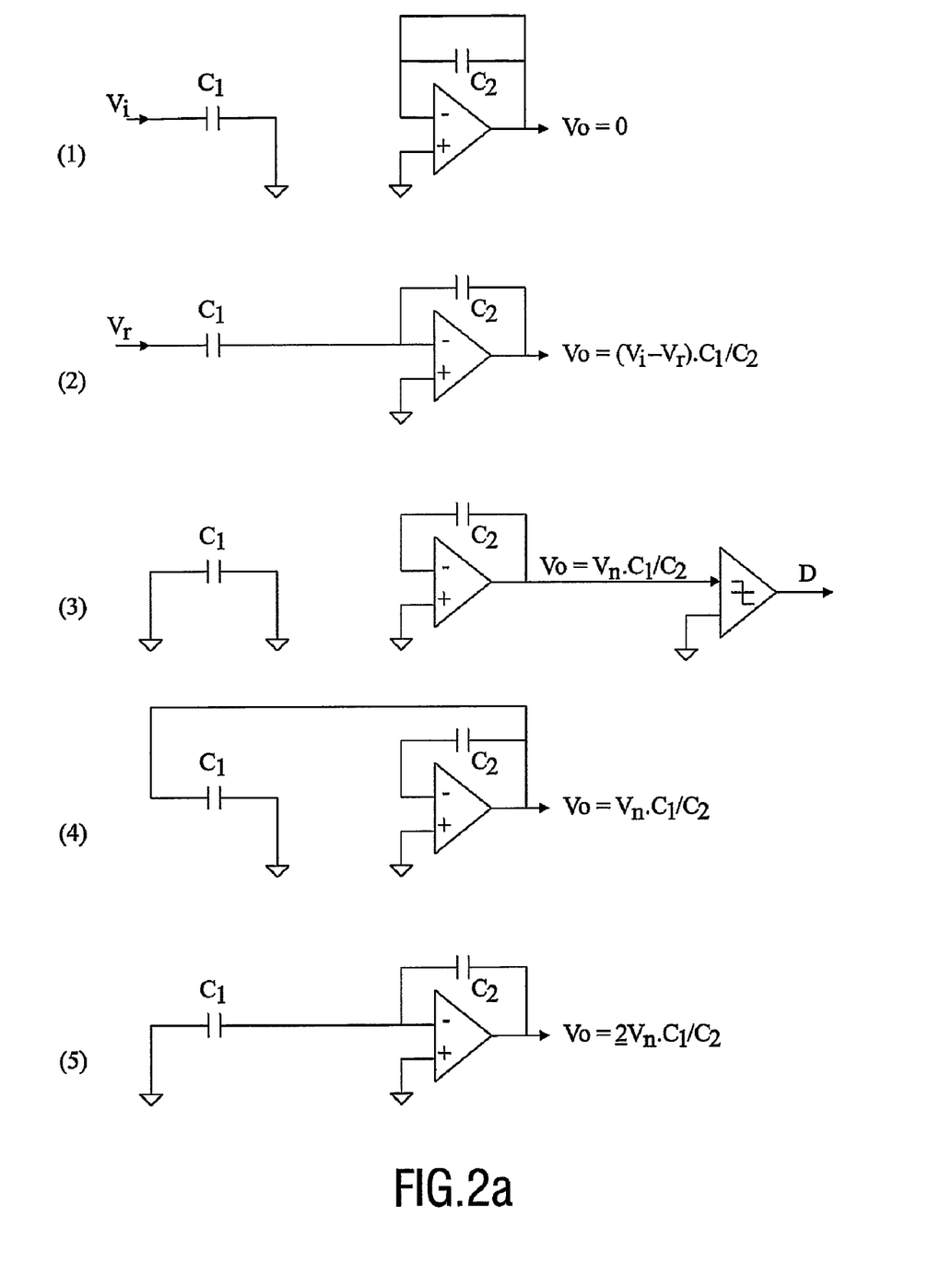
FIGS. 2a and 2b the topology of the clock phases of the AD converter of FIG. 1.
Figure 2B:
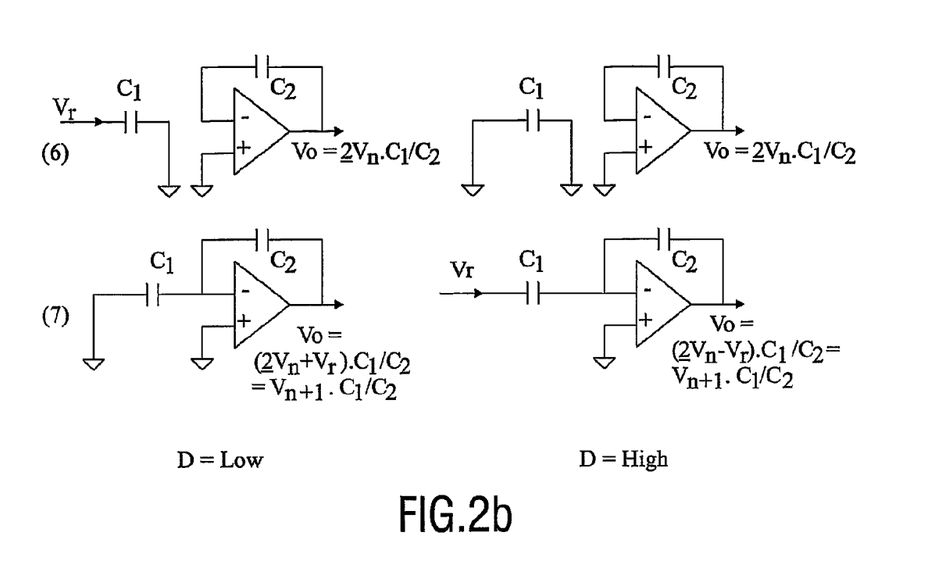

The operation of the converter of FIG. 1 will be explained with reference to FIGS. $2_a$-$2_b$ which shows the topology of the converter during the various clock phases. The clock phases indicated (1) and (2) together form the first phase-group for generating the difference signal, clock phase (3) alone constitutes the second phase-group for generating the digital bit D, clock phases (4) and (5) form the third phase-group serving the multiplication of the difference signal by the factor 2 and clock phases (6) and (7) (see FIG. $2_b$) form the fourth phase-group for the bit-dependent shifting of the multiplied difference signal.

The signal generated in clock-phase (7) is used as input signal for the next cycle that starts with clock phase (3). Therefore each cycle consists of the clock-phases (3) to (7); the clock-phases (1) and (2) fall outside the cycle and serve the generation of the difference signal for entering the first cycle. During the execution of the first cycle the most significant bit of the digital output is produced and during each further cycle each lesser significant bit. The digital word is available at the output of the converter in serial format and may be transformed into parallel digital words in a serial to parallel converter (not shown).

(1) During the first clock phase the switches $S_0$, $S_1$ and $S_4$ are closed and the other switches are open. The input voltage V; charges the sampler capacitor $C_1$ through the switches $S_1$, $S_4$ and the voltage across the integrator capacitor 2 is reset to zero through the switch $S_0$.

(2) During the second phase the switches $S_2$, $S_5$ and $S_7$ are closed and all other switches are open. The inverting input of the opamp is at virtual ground due to the feedback through the integrator capacitor $C_2$. The reference voltage $V_r$ is applied to the left hand plate of $C_1$ thereby changing the charge of $C_1$ by $(V_i-V_r).C_1$. This change in charge is shifted into the capacitor $C_2$ thereby generating a voltage $(V_i-V_r).C_1/C_2$ across this capacitor and at the opamp-output O.

(3) During the third phase the switches $S_3$, $S_4$ and $S_7$ are closed and all other switches are open. The charge of $C_1$ is zeroed through $S_3$ and $S_4$. The opamp-output is unaltered. Because this clock phase is the start of each cycle the opamp-output is referenced in FIG. 2a by $V_n.C_1/C_2$ in which the subscript n denotes the number of the cycle actually executed. Therefore during the first cycle the opamp-output voltage of the third phase is $Vo=V_1.C_1/C_2$ with $V_1=(V_i-V_r)$. This signal is applied to the comparator Q to generate the first bit D. If $V_1$ is in the lower half of its range $V_i-V_r$ is negative and D=low. If $V_1$ is in the upper half of its range $V_i-V_r$ is positive and D=high.

(4) During the fourth phase the switches $S_4$, $S_7$ and $S_8$ are closed and all other switches are open. The output voltage Vo remains unchanged $Vo=V.C_1/C_2$ but the sampler capacitor $C_1$ is effectively connected across the opamp-output and this capacitor gets the same voltage as the capacitor $C_2$.

(5) During the fifth phase the switches $S_3$, $S_5$ and $S_7$ are closed and all other switches are open. The capacitor $C_1$ is connected between ground and the virtual ground of the inverting input of the opamp. Therefore this capacitor looses its charge and this charge is transferred to the integrating capacitor $C_2$. Consequently the voltage across this capacitor and also the opamp-output voltage Vo is substantially doubled what is expressed by $Vo=\underline{2}V.C_1/C_2$. The factor 2 is underscored to indicate that this factor is not independent from the capacitance ratio $C_1/C_2$. This is due to the fact that the voltage $Vn.C_1/C_2$, impressed on $C_1$ during the fourth phase, results in a charge $Vn.C^2_1/C_2$ in this capacitor and during the fifth phase this charge is added to the charge $Vn.C_1$ in $C_2$ so that in the end a voltage $V_n.(1+C_1/C_2).C_1/C_2$ results across the capacitor $C_2$ and at the output of the opamp. As explained in the introduction the factor $C_1/C_2$ does not affect the generation of the next bit, but the term $C_1/C_2$ in the multiplication factor does have adverse effect on this generation. In practice this error is relatively small, however this error is unacceptably high when the digital word to be produced has 10 bits or more. In connection with FIGS. 3 to 5 methods and arrangements to reduce or to avoid the error in the multiplication factor will be disclosed.

(6) and (7) During the sixth and seventh clock phases the switches closed depend from the value of the bit D produced during the third phase. When D is low the switches $S_2$, $S_4$ and $S_7$ are closed and all other switches are open. The voltage across the capacitor $C_2$ remains unaltered and the sampler capacitor $C_1$ is charged by the reference voltage $V_r$. When the seventh phase starts the switches $S_2$ and $S_4$ open and the switches $S_3$ and $S_5$ close. The charge of $C_1$ now shifts into $C_2$ whereby the voltage across $C_2$ and the opamp-output voltage increase by $Vr.C_1/C_2$. It is important that this voltage shift is proportional to the capacitor ratio $C_1/C_2$ with the result that the output voltage $Vo=(\underline{2}V_n+V_r).C_1/C_2$ remains proportional to this capacitor ratio.

When the bit D generated during the third clock-phase is high the switches closed during the sixth phase are $S_3$, $S_4$ and $S_7$. In fact the voltages across the two capacitors are unchanged with respect to the voltages generated during the fifth phase but the sixth phase is necessary to keep the sequence in synchronism with the sequence when D is low. During the seventh phase the switches $S_2$, $S_5$ and $S_7$ are closed and all other switches are open. Now the capacitor $C_1$ is loaded by the charge $V_r.C_1$ and this charge is subtracted from the charge of integrator capacitor $C_2$. This results in the voltage $(\underline{2}V_n-V_r).C_1/C_2$ across the capacitor $C_2$ and at the opamp-output.

Thereafter the sequence is repeated for the production of the next bit, starting with the third phase (3) whereby the analog voltage $V_{n+1}=\underline{2}V_n+V_r$ for D is low and $V_{n+1}=\underline{2}V_n-V_r$ for D is high.

When for some reason during the second phase group the bits have to be produced by comparing the difference signal $V_n.C_1/C_2$ with a comparison value that is unequal to zero, the factor $C_1/C_2$ will disturb the production of the bit. This may be avoided by replacing the second phase group consisting of phase (3) by the phase group with three clock phases (3a), (3b) and (3c) shown in FIG. 3.

Figure 3:
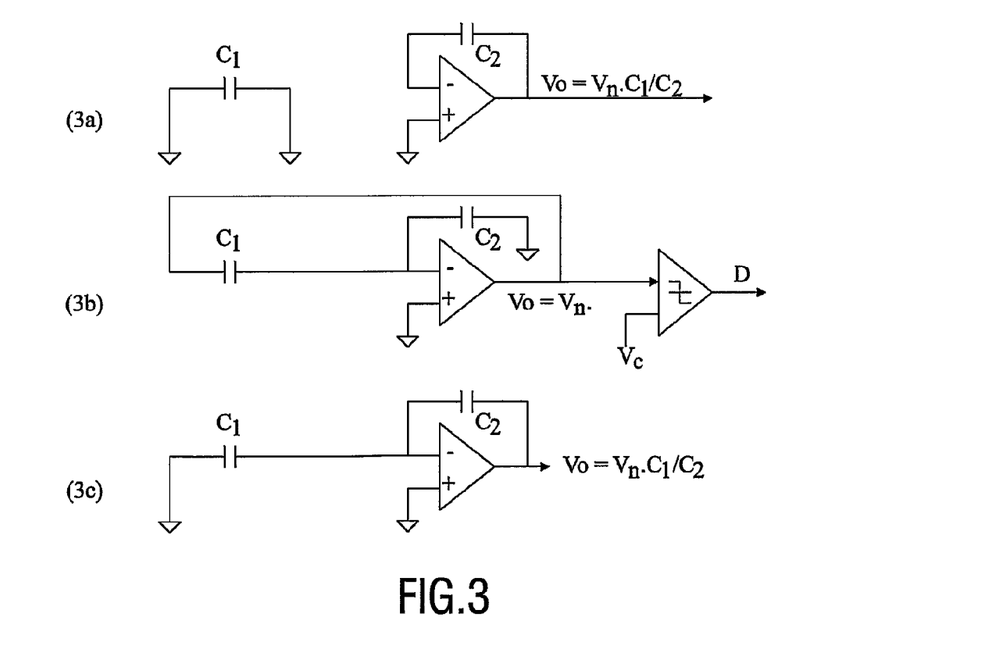
FIG. 3 the topology of the clock phases of a modification of the AD converter of FIG. 1, FIG. 4 the topology of the clock phases of a process for trimming the capacitors of a cyclic AD converter according to the invention, FIG. 5 a second modification of the cyclic AD converter according to the invention, FIG. 6 the topology of the clock phases of the modification of FIG. 5, FIG. 7 a fully differential implementation of the cyclic AD converter of FIG. 1 and FIG. 8 a third modification of the cyclic AD converter according to the invention.

(3a) During the phase (3a) the switches $S_3$, $S_4$ and $S_7$ of FIG. 1 are closed and all other switches are open, just as in the original phase (3). The difference is that in phase (3a) the opamp-output signal is not yet compared in the comparator Q. The capacitor $C_1$ is discharged and the charge $V_n.C_1$ in capacitor $C_2$ is preserved.

(3b) During this phase the switches $S_5$, $S_6$ and $S_8$ are closed and all other switches are open. The charge $V_n.C_1$ of capacitor $C_2$ is transferred to $C_1$ with the result that the voltage across $C_1$ and also the opamp-output voltage Vo is equal to $V_n$, i.e. this voltage is not corrupted by the capacitance ratio $C_1/C_2$ and can therefore be compared in comparator Q with any suitable reference voltage $V_c$.

(3c) This phase, during which the switches $S_3$, $S_5$ and $S_7$ are closed and all other switches are open, serves to restore the situation of phase (3a). The charge of capacitor $C_1$ is retransferred to the capacitor $C_2$ and again the output voltage of the opamp is $V_n.C_1/C_2$.

Figure 4:
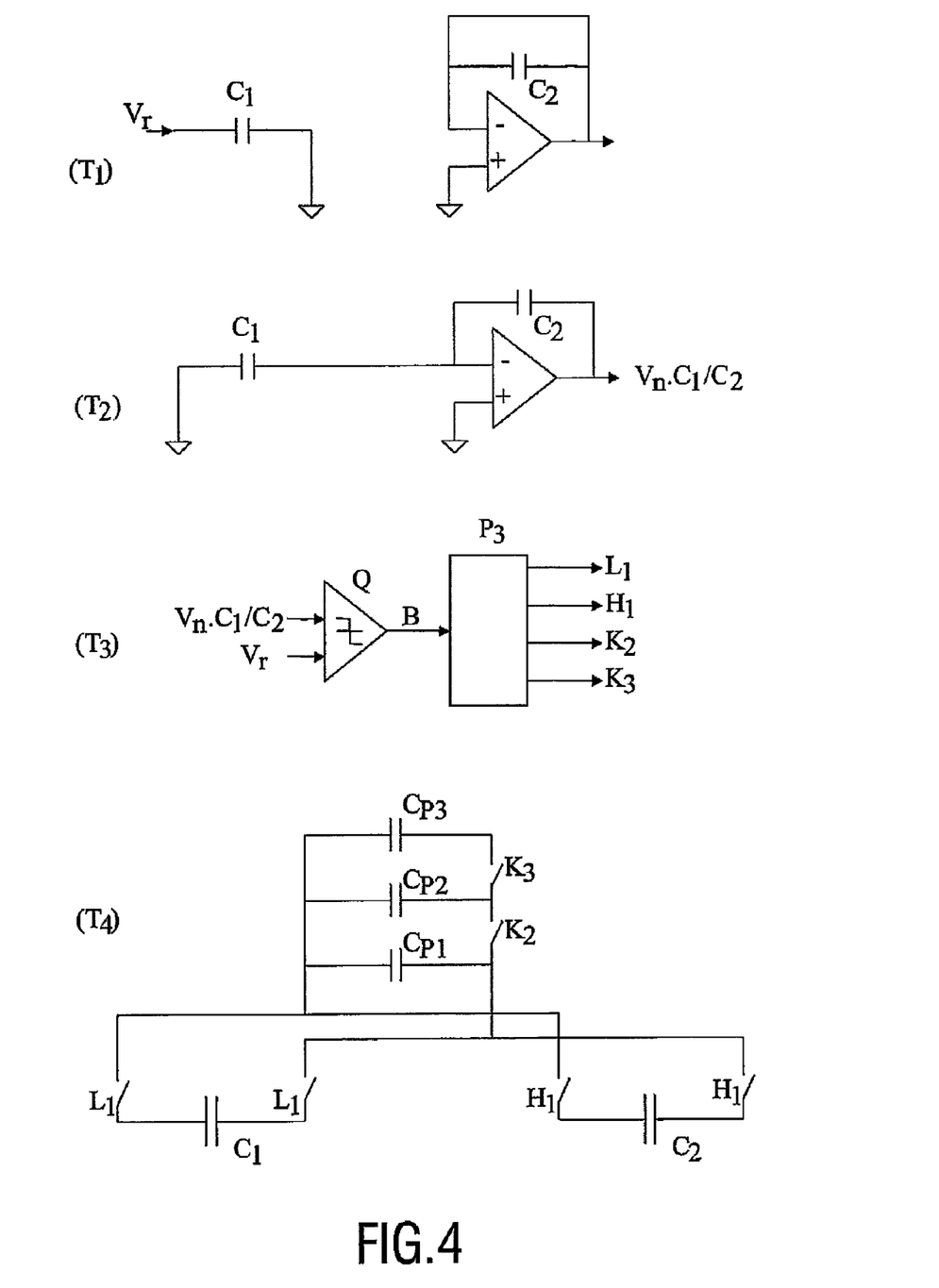

With the method disclosed above with reference to FIGS. 1 to 3 the dependency of the bits on the capacitor mismatch is substantially reduced by about 75% with respect to the prior art, however the remaining mismatch dependency due to the corrupted multiplication factor $\underline{2}$ may still be too high in practice. FIG. 4 discloses a method to further reduce the mismatch problems by means of a trimming process that reduces the inequality between the sampler capacitor $C_1$ and the integrator capacitor $C_2$. This trimming process may e.g. be executed at the start of a conversion or with regular intervals during a conversion.

During a first phase ($T_1$) of the trimming process the switches $S_0$, $S_2$ and $S_4$ of FIG. 1 are closed and all other switches are open. The sampler capacitor is charged by the reference voltage $V_r$ and simultaneously the integrator capacitor $C_2$ is discharged. It may be noted that instead of the reference voltage $V_r$ any other suitable constant voltage may be used for the trimming process.

During a second phase ($T_2$) the switches $S_3$, $S_5$ and $S_7$ of FIG. 1 are closed and all other switches are open. Thereby the charge $V_r.C_1$ of capacitor $C_1$ is transferred to the capacitor $C_2$, so that across this capacitor and at the opamp-output a voltage $V_r.C_1/C_2$ occurs.

During a third phase ($T_3$) this opamp-output voltage is applied to the comparator Q where this voltage is compared with the reference voltage $V_r$. The comparator delivers a bit B that is high when the opamp-output voltage is higher than $V_r$, i.e. if the capacitance of $C_1$ is larger than that of $C_2$ and that is low when the capacitance of $C_1$ is lower than that of $C_2$. The bit B is applied to a pulse generator $P_3$ that generates pulses $L_1$, $H_1$, $K_2$ and $K_3$ for controlling corresponding switches shown in FIG. 4 in the fourth phase ($T_4$) of the trimming process.

In FIG. 4 the topography of this fourth phase shows the two capacitors $C_1$ and $C_2$, two switches $L_1$ for connecting a trimmer capacitor $C_{p1}$ in parallel with the capacitor $C_1$ and two switches $H_1$ that connect the trimmer capacitor $C_{p1}$ in parallel with the capacitor $C_2$. A switch $K_2$ is provided for connecting a second trimmer capacitor $C_{p2}$ in parallel with the first trimmer capacitor $C_{p1}$ and a switch $K_3$ serves the connection of a third trimmer capacitor $C_{p3}$ in parallel with the second trimmer capacitor $C_{p2}$.

In operation, when the capacitance of $C_1$ is lower then the capacitance of $C_2$, the bit B is low and this makes the pulse generator to close the two switches $L_1$. The trimmer capacitor $C_o$ is connected in parallel with the capacitor $C_1$ thereby making the capacitance ratio $C_1/C_2$ higher. A new trimming cycle starts and if the capacitance ratio $C_1/C_2$ is still too low the pulse generator $P_3$ generates a pulse for the switch $K_2$ so that the second trimmer capacitor is also connected in parallel with $C_1$. Again a new cycle starts and if the ratio $C_1/C_2$ is now higher than 1 no further pulse is delivered by the pulse generator $P_3$ and the trimming process is halted. On the other hand, when the ratio is still lower than 1 a pulse for the switch $K_3$ is generated and the trimming capacitor $C_{p3}$ is connected in parallel with $C_1$, $C_{p1}$ and $C_{p2}$. If during the first cycle the ratio $C_1/C_2$ is higher than 1 the switches $H_1$ are closed instead of the switches $L_1$ and the same procedure increases the capacitance $C_2$.

In practice the trimming capacitors $C_{p1}$, $C_{p2}$ and $C_{p3}$ may have value of about 1% of the capacitance of $C_1$ and $C_2$. If necessary the trimming range may be increased by increasing the number of trimming capacitors and the resolution of the trimming process may be increased by decreasing the capacitance value of the trimming capacitors both of course at the expense of more iterations in the calibration process.

Another method to reduce the influence of the capacitor mismatch on the multiplication factor in the cyclic AD converter of FIG. 1 is explained with reference to the FIGS. 5 and 6. The elements of FIG. 5 that correspond to elements of the converter of FIG. 1 have been given the same reference numerals. The cyclic AD converter of FIG. 5 additionally has five switches $S_9$ to $S_{13}$ and a storage capacitor $C_3$. The switches $S_9$ and $S_{10}$ connect the left hand plate of integrator capacitor $C_2$ respectively to the inverting input of the opamp and ground. The storage capacitor $C_3$ has one plate grounded while the other plate is connected through switches $S_{11}$ and $S_{12}$ to respectively the output and the non-inverting input of the opamp. Moreover a switch $S_{13}$ is connected between this non-inverting input and ground. A pulse generator $P_2$ has outputs for controlling each of the switches $S_0$ to $S_{13}$.

The first phase group with the clock phases (1) and (2), the second phase group with the clock phases (3) or (3a), 3(b), 3(c) and the fourth phase group with the clock phases (6) and (7) are identical to those as described and shown earlier with reference to FIGS. 1, 2a-2b and 3. Only the fourth phase group performing the multiplication by the factor 2 is replaced by the clock phases (4a), (5a) and (5b) shown in FIG. 6. The operation is as follows:

(4a) During this clock phase the switches $S_4$, $S_7$, $S_8$, $S_9$, $S_{11}$ and $S_{13}$ are closed and the other switches are open. The opamp-output voltage $Vo=V_n.C_1/C_2$ is unchanged and impressed upon the two capacitors $C_1$ and $C_3$.

(5a) During clock phase (5a) the switches $S_5$, $S_7$, $S_8$, $S_{10}$ and $S_{12}$ are closed and all other switches are open. The storage capacitor $C_3$ is connected to the non-inverting input of the opamp and consequently raises all the voltages of the opamp by $V_n.C_1/C_2$. Moreover the capacitor $C_1$ that is now connected between the inverting input and the output of the opamp raises the output voltage of the opamp by another $V_n.C_1/C_2$ so that the opamp-output voltage is now doubled to $2.Vn.C_1/C_2$. This voltage is impressed on the capacitor $C_2$. The multiplication factor 2 that in the arrangement of FIG. 1 was corrupted by the capacitance ratio $C_1/C_2$ is uncorrupted in the arrangement of FIG. 5.

(5b) During clock phase (5b) the switches $S_3$, $S_4$, $S_7$, $S_9$ and $S_{13}$ are closed and all other switches are open. The capacitor $C_1$ is discharged and the capacitor $C_2$ with the multiplied voltage $2.Vn.C_1/C_2$ is switched back to its normal position between the inverting input and the output of the opamp.

It may be noted that the storage capacitor $C_3$ may have a much smaller capacitance than the capacitors $C_1$ and $C_2$ because $C_3$ need not to deliver charge to another capacitor, but only has to raise the voltage of the opamp inputs. For the capacitor $C_1$ in FIG. 6 also a small storage capacitor may be used but this would mean that more switches are required.

Figure 7:
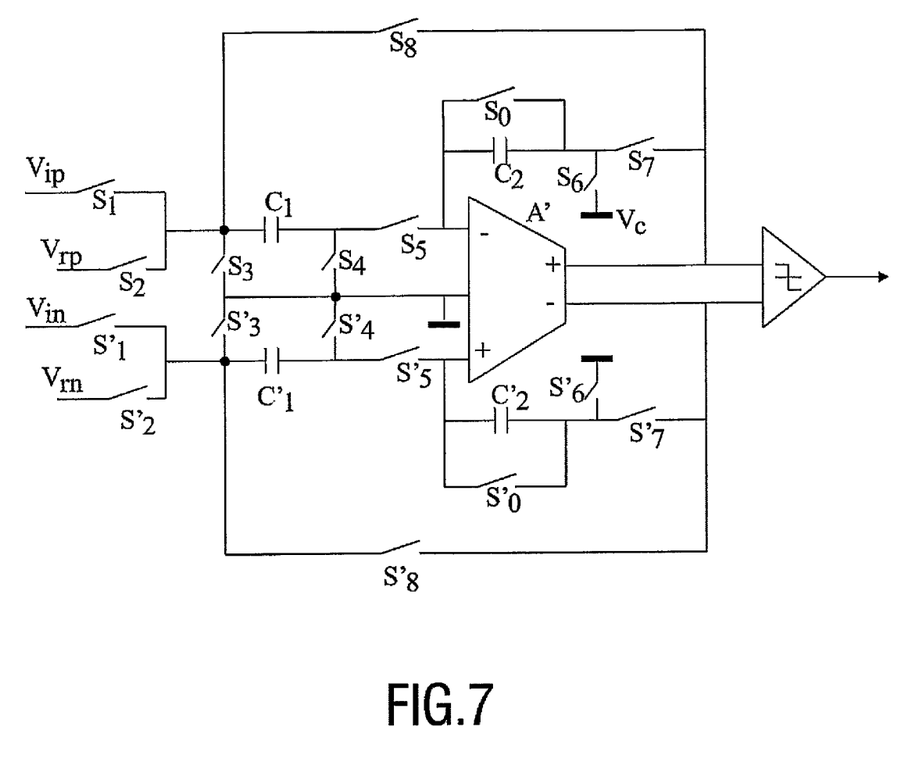

The arrangements shown and described above may be extended to a fully differential structure. An example thereof is shown in FIG. 7 that shows a differential structure of the arrangement of FIG. 1. The opamp A' is a differential amplifier with a two-terminal (differential) output. The arrangement comprises two sampler capacitors $C_1$ and $C'_1$ and two integrator capacitors $C_2$ and $C'_2$ while also each of the switches $S_0 \ldots S_8$ has its differential counterpart $S'_0 \ldots S'_8$. The common mode voltage Vc is usually about equal to half the supply voltage to have an optimal voltage swing. The input consists of differential input signals $V_{ip}$ and $V_{in}$ that are centered around $V_c$ and also the reference signal consists of differential reference signals $V_{rp}$ and $V_{rn}$ that are centered around $V_c$.

Figure 5:
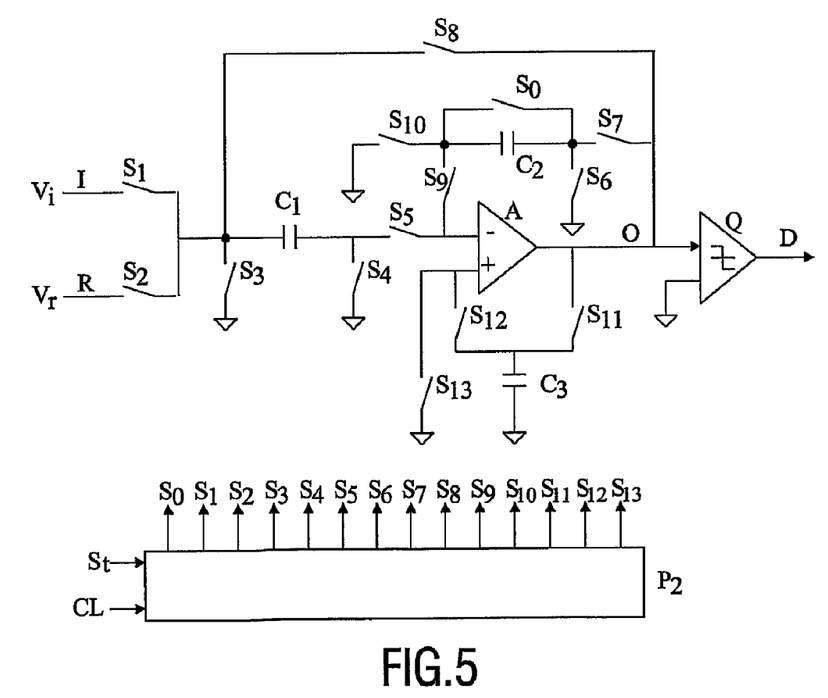

The arrangement of FIG. 5, with the storage capacitor $C_3$ connected to the non-inverting input of the opamp, cannot be extended to a fully differential structure because then the non-inverting input of the opamp is not available for the multiplication by two. This problem may be solved by modifying the arrangement of FIG. 5 so that the storage capacitor $C_3$, instead of being connected to the non-inverting input of the opamp, is connected with proper polarity in series with the capacitor $C_1$ between the opamp output and the inverting input of the opamp. This leaves the non-inverting input free for the differential operation. This modification of FIG. 5 is shown in FIG. 8 in which corresponding elements with those of FIG. 5 have the same reference numerals.

Figure 6:
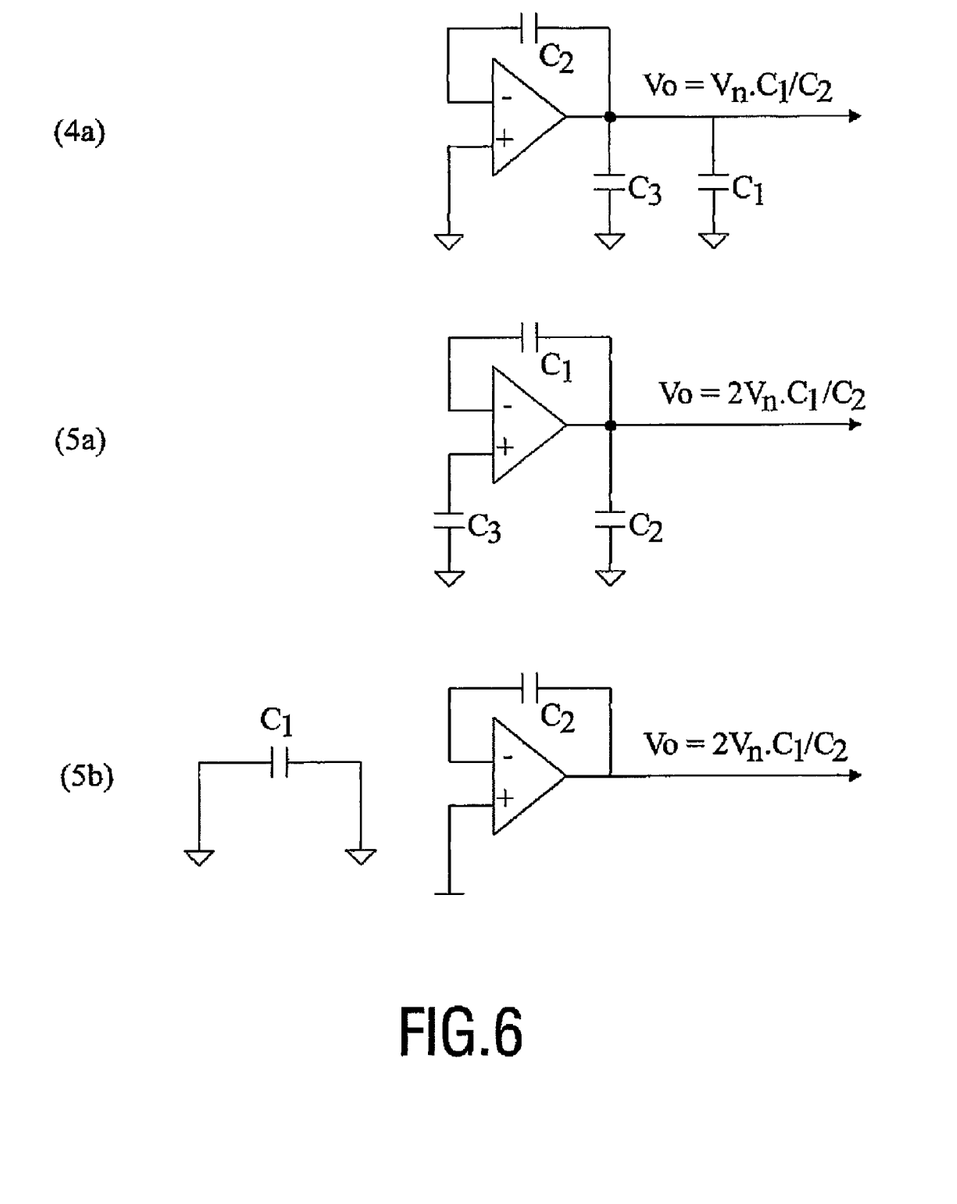
Figure 8:
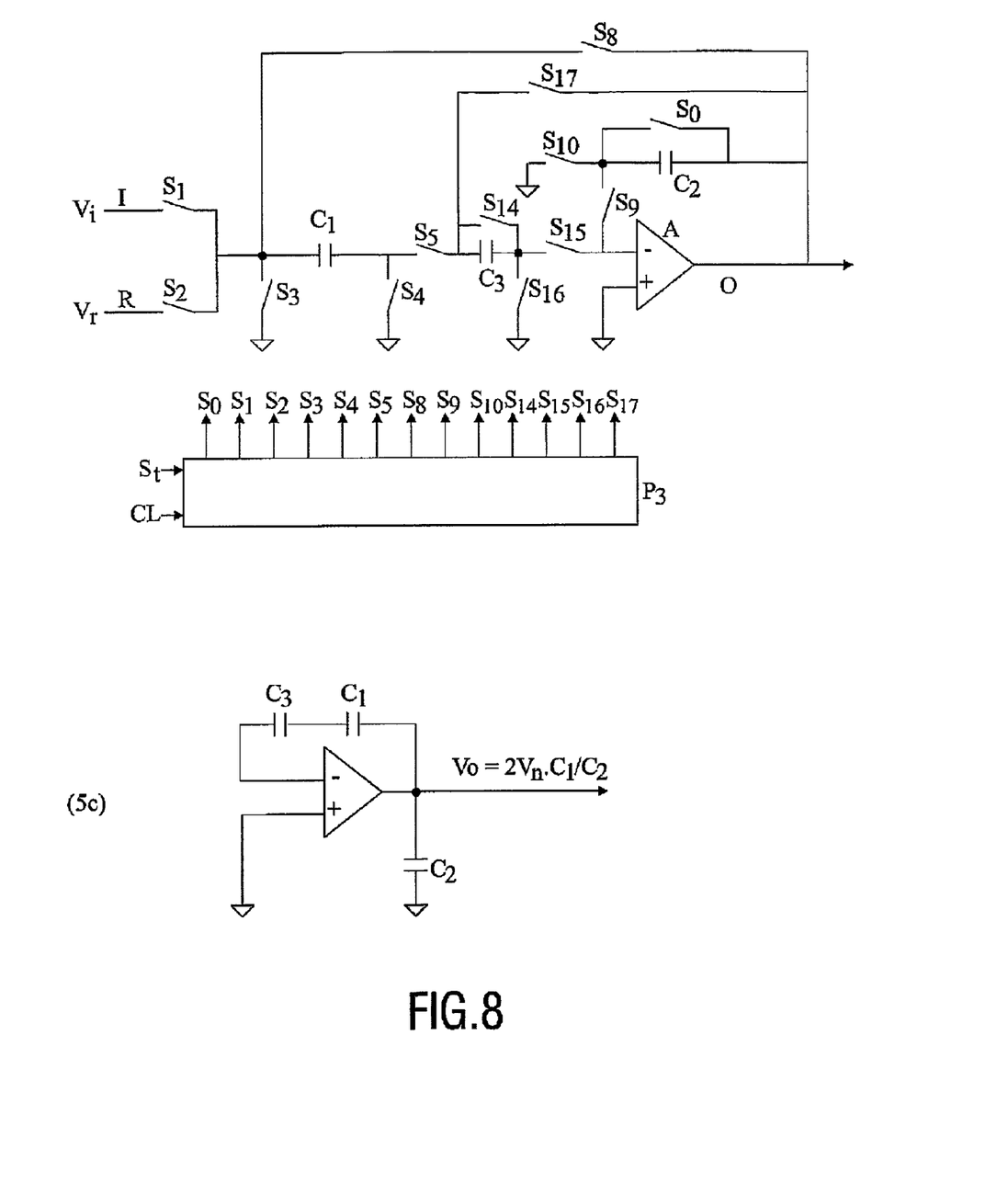

The clock-phase topologies of this arrangement are identical to those of the arrangement of FIG. 5 except in that the clock-phase topology (5a) shown in FIG. 6 is replaced by the clock-phase topology (5c) shown in FIG. 8. The clock-phase topologies of FIG. 3 are not implemented in the arrangement of FIG. 8. Therefore the clock-phase topologies of FIG. 8 are (1), (2), (3), (4a), (5c), (5b), (6), (7) and the switches of FIG. 8 that are closed during the clock-phases are:

| | | |
|---|---|---|
| (1) | $S_1$, $S_4$, $S_9$ ($S_{14}$, $S_{16}$) | |
| (2) | $S_2$, $S_5$, $S_{14}$, $S_{15}$, $S_9$ | |
| (3) | $S_3$, $S_4$, $S_9$ ($S_{14}$, $S_{16}$) | |
| (4a) | $S_4$, $S_8$, $S_{16}$, $S_{17}$, $S_9$ | |
| (5c) | $S_{15}$, $S_5$, $S_8$, $S_{10}$ | |
| (5b) | $S_3$, $S_4$, $S_9$ ($S_{14}$, $S_{16}$) | |
| | D low | D high |
| (6) | $S_2$, $S_4$, $S_9$ ($S_{14}$, $S_{16}$) | $S_3$, $S_4$, $S_9$ ($S_{14}$, $S_{16}$) |
| (7) | $S_3$, $S_5$, $S_{14}$, $S_{15}$, $S_9$ | $S_2$, $S_5$, $S_{14}$, $S_{15}$, $S_9$ |

The switches between brackets may optionally be closed during the referenced clock-phase.

In summary, the invention relates to a method and arrangement for cyclically AD converting an analog signal with a sampler capacitance and an integrator capacitance, comprising the steps of generating a difference signal multiplied by the ratio of said capacitances from the analog signal and a reference signal, deriving a digital bit from said difference signal, doubling the difference signal multiplied by said ratio, shifting said doubled signal by the reference signal multiplied by said ratio and using the shifted signal as difference signal multiplied by said ratio for the next cycle.

The invention claimed is:

1. A method for cyclically converting an analog input signal to a digital output signal with a sampler capacitance and an integrator capacitance characterized by comprising the steps of generating a difference signal by multiplying the difference of the analog signal and a reference signal by the ratio of said capacitances, deriving at least one digital bit from said difference signal, substantially doubling the difference signal, shifting said doubled difference signal by the reference signal multiplied by said ratio and using the shifted signal as difference signal multiplied by said ratio for a next cycle.

2. A method as claimed in claim 1 whereby the digital output signal is a multi-bit digital word generated by means of an operational amplifier having an opamp-output connected to a comparator the sampler capacitor the integrator capacitor and switch means arranged and controlled to perform the conversion, characterized by:

generating the difference signal during a first phase-group of one or more clock-phases at the opamp-output, deriving the at least one digital bit during a second phase-group of one or more clock-phases for constituting the digital word and delivering at said opamp-output said difference signal multiplied by said capacitance ratio, substantially doubling the difference signal by generating during a third phase-group of one or more clock-phases at the opamp-output a doubled difference signal which is substantially twice said analog difference signal multiplied by said capacitance-ratio, shifting said doubled difference signal by generating during a fourth phase-group of one or more clock-phases at the opamp-output a shifted analog signal which is the opamp-output signal delivered by the previous phase-group shifted by a bit-dependent reference signal multiplied by said capacitance ratio, and using said shifted signal as difference signal for the second phase-group of the next cycle.

3. A method as claimed in claim 2 characterized by transferring during the second phase-group the charge of the integrator capacitor into the sampler capacitor generating said at least one bit for constituting the digital word from the voltage across the sampler capacitor and subsequently transferring the charge of the sampler capacitor back into the integrator capacitor.

4. A method as claimed in claim 2 characterized by an iterative calibration process comprising the steps of charging the sampler capacitor with a calibration voltage of transferring the charge of the sampler capacitor to the integrator capacitor of comparing the voltage across the integrator capacitor with said calibration voltage and of adding trimming capacitance to the sampler capacitance if the result of said comparison is higher than 1 and by adding trimming capacitance to the integrator capacitance when the result of the comparison is lower than 1.

5. A method as claimed in claim 2 characterized by the third phase-group comprising the steps of storing the opamp-output voltage in first and second storage capacitors of connecting the first and second storage capacitors in series with the input of the opamp and connecting the integrator capacitor to the output of the opamp whereby the voltages of the first and second storage capacitors are added in the integrator capacitor, and of subsequently connecting the integrator capacitor between the inverting input and the output of the opamp.

6. An arrangement for cyclically converting an analog input signal to a digital output signal with a sampler capacitance and an integrator capacitance characterized by being arranged for performing the steps of generating a difference signal by multiplying the difference of the analog signal and a reference signal by the ratio of said capacitances, deriving at least one digital bit from said difference signal, substantially doubling the difference signal, shifting said doubled difference signal by the reference signal multiplied by said ratio and using the shifted signal as difference signal multiplied by said ratio for a next cycle.

* * * * *